United States Patent [19]
Urata et al.

[11] Patent Number: 6,097,219
[45] Date of Patent: Aug. 1, 2000

[54] OUTPUT BUFFER CIRCUIT WITH ADJUSTABLE DRIVING CAPABILITY

[75] Inventors: Ichiro Urata; Takao Uchida, both of Tokyo, Japan

[73] Assignee: Oki Data Corporation, Tokyo, Japan

[21] Appl. No.: 09/072,536

[22] Filed: May 4, 1998

[30] Foreign Application Priority Data

May 14, 1997 [JP] Japan .................................... 9-122752

[51] Int. Cl.[7] .............................................. H03K 19/0175
[52] U.S. Cl. .................................. 326/83; 326/87; 326/47
[58] Field of Search .................................. 326/47, 49, 83, 326/86, 56, 57, 87

[56] References Cited

U.S. PATENT DOCUMENTS 5,621,335  4/1997  Andresen ................................... 326/30
5,804,987  9/1998  Ogawa et al. ............................ 326/40

Primary Examiner—Michael Tokar
Assistant Examiner—Anh Tran
Attorney, Agent, or Firm—Akin, Gump, Stauss, Hauer & Feld, L.L.P.

[57] ABSTRACT

An output buffer circuit drives an output terminal of an integrated circuit by means of at least two buffer circuits. A buffer control circuit in the output buffer circuit selectively enables or disables the buffer circuits to provide a driving capability suitable for the load connected to the output terminal. The buffer control circuit can decide which buffer circuits to disable by sensing the transition time of a signal output from the output terminal following a reset.

13 Claims, 10 Drawing Sheets

FIG. 6

| DRIVING CAPABILITY | HOLD-N HIGH, SG₁ | | | | |
|---|---|---|---|---|---|
| | $Q_2$ | $Q_1$ | DOWN | UP | COUNT (DOUT) |
| TOO HIGH | LOW | LOW | HIGH | LOW | DECREMENT |
| SUITABLE | LOW | HIGH | LOW | LOW | NO CHANGE |
| TOO LOW | HIGH | HIGH | LOW | HIGH | INCREMENT |

FIG. 7

| DOUT₂ | DOUT₁ | $E_3$ | $E_2$ | $E_1$ |
|---|---|---|---|---|
| HIGH | HIGH | LOW | LOW | LOW |
| HIGH | LOW | HIGH | LOW | LOW |
| LOW | HIGH | HIGH | HIGH | LOW |
| LOW | LOW | HIGH | HIGH | HIGH |

OUTPUT BUFFER CIRCUIT WITH ADJUSTABLE DRIVING CAPABILITY

BACKGROUND OF THE INVENTION

The present invention relates to an output buffer circuit useful in a large-scale integrated circuit.

Large-scale integrated circuits (LSI circuits) have output buffers that drive output terminals connected to loads in external circuits. The required driving capability of an output buffer circuit varies, depending on the total capacitance of the connected loads. If the driving capability greatly exceeds the requirements of the load, signal distortion problems such as overshoot and undershoot may occur, and unwanted electromagnetic interference may be generated by too-fast signal transitions. If the driving capability falls greatly short of the load requirements, however, the response of the output signal may become too slow to satisfy necessary timing conditions.

The driving capability of the output buffer circuits conventionally employed in large-scale integrated circuits is fixed. Not infrequently, output terminals of large-scale integrated circuits must be connected to loads that are unsuitable for the fixed driving capability. The conventional solution to this problem is to insert external damping resistors between the output terminals and loads if the driving capability is excessive, and to add external buffer circuits if the driving capability is deficient.

Unfortunately, damping resistors and external buffer circuits take up space on printed circuit boards, and add to total circuit costs. Moreover, different types of resistors and external buffer circuits must be used, depending on the specific loads to be driven. Consequently, when a circuit design is changed in a way that alters a load, additional changes in resistor values or external buffer parameters may also become necessary, creating additional work for the circuit designer and circuit manufacturer.

SUMMARY OF THE INVENTION

It is accordingly an object of the present invention to enable the output terminals of a large-scale integrated circuit to drive a variety of different loads without external damping resistors or external buffer circuits.

Another object of the invention is to provide an output buffer circuit that automatically adapts its driving capability to the connected load.

The invented output buffer circuit receives an input signal generated within an integrated circuit and generates a corresponding output signal at an output terminal of the integrated circuit. The output buffer circuit comprises a buffer control circuit generating a selection signal, and an adjustable buffer circuit receiving the selection signal from the buffer control circuit and receiving the input signal from the processing circuits. The adjustable buffer circuit has a plurality of buffer circuits that are selectable by the selection signal. Each buffer circuit that is selected by the selection signal drives the output terminal according to the input signal. Buffer circuits that are not selected by the selection signal are, for example, placed in a high-impedance state.

The buffer control circuit preferably sets the selection signal by sensing a voltage transition time at the output terminal when the integrated circuit is released from the reset state. In a preferred mode of operation, the processing circuits generate a series of pulses of the input signal when the integrated circuit is released from the reset state, and the buffer control circuit adjusts the selection signal according to the transition times produced at the output terminal in response to these pulses, until the adjustable output buffer circuit has a driving capability suitable for the load connected to the output terminal.

The invented output buffer circuit may include a plurality of adjustable buffer circuits, connected to a plurality of output terminals, all controlled by the same selection signal.

BRIEF DESCRIPTION OF THE DRAWINGS

In the attached drawings:

FIG. 6 is a chart summarizing the operation of the up-down counter in FIG. 5;

FIG. 7 is a chart summarizing the operation of the decoder in FIG. 5;

DETAILED DESCRIPTION OF THE INVENTION

An embodiment of the invention will be described with reference to the attached exemplary drawings.

Figure 1:
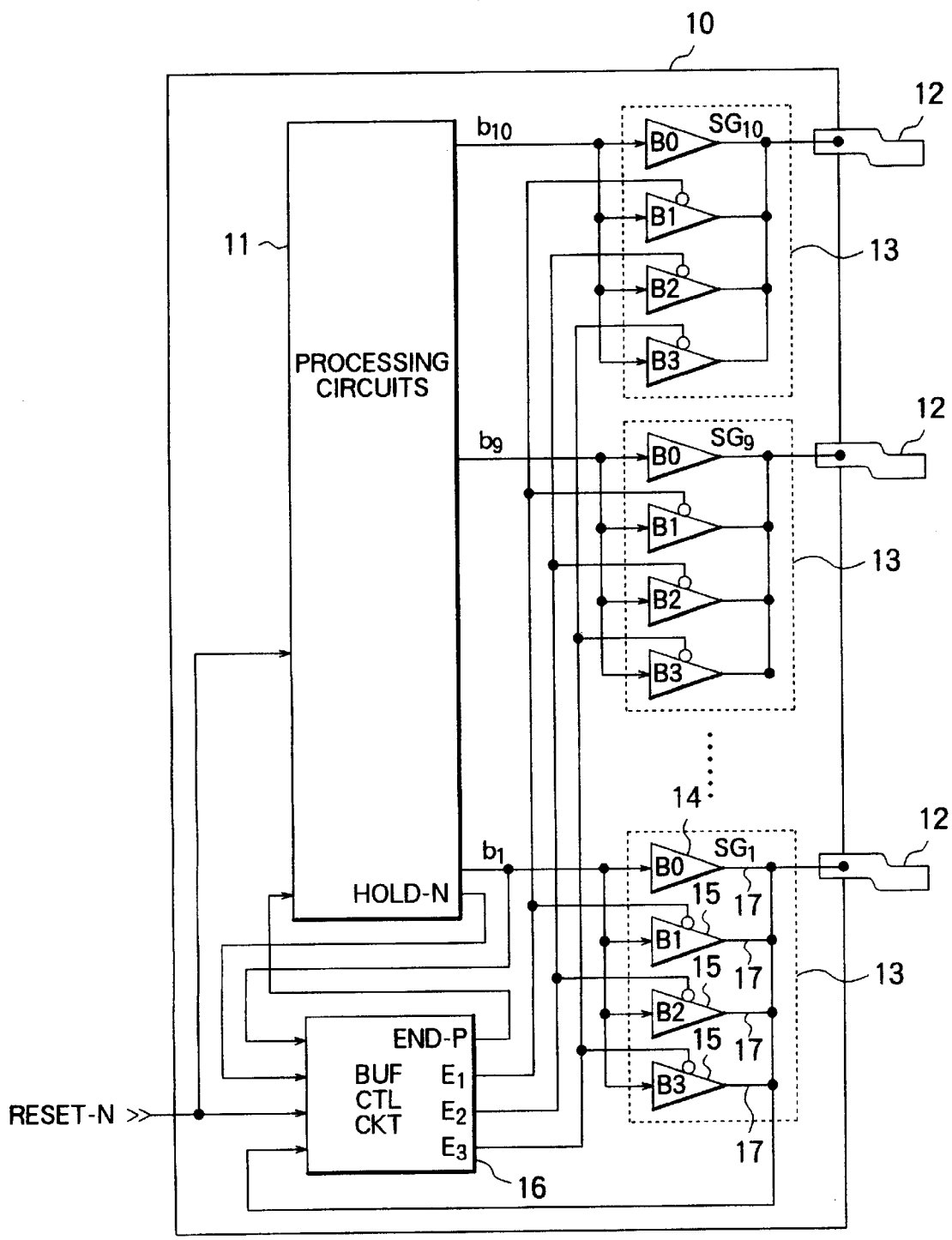
FIG. 1 is a block diagram of a large-scale integrated circuit employing the invented output buffer circuit.

Referring to FIG. 1, the embodiment is disposed in a large-scale integrated circuit 10 with processing circuits 11 that generate bit signals $b_{10}, b_9, \ldots, b_1$ which must be output at respective output terminals 12. These bit signals $b_i$ (i=1, . . . , 10) are, for example, address signals or data signals, with high and low logic levels. The most significant bit is $b_{10}$; the least significant bit is $b_1$.

Each of the bit signals $b_i$ is sent to a corresponding adjustable buffer circuit 13 comprising a two-state buffer circuit 14, denoted B0, and a trio of three-state buffer circuits 15, denoted B1, B2, and B3. The three-state buffer circuits B1, B2, and B3 are controlled by respective enable signals $E_1$, $E_2$, and $E_3$ generated by a buffer control circuit (BUF CTL CKT) 16. In each adjustable buffer circuit 13, the output signal lines 17 of buffer circuits B0, B1, B2, and B3 are connected in common to a single output terminal 12. The enable signals $E_1$, $E_2$, and $E_3$ operate collectively as a selection signal selecting which of the buffer circuits B0, B1, B2, and B3 are used to drive the output terminal 12. Buffer circuit B0 is always selected; the other buffer circuits B1, B2, and B3 may also be selected.

The signals output by the adjustable buffer circuits 13 at the output terminals 12 are denoted $SG_{10}, SG_9, \ldots, SG_1$. All of the output signals $SG_i$ (i=1, . . . , 10) drive similar capacitive loads.

Besides generating the enable signals $E_1$, $E_2$, and $E_3$, the buffer control circuit 16 outputs an END-P control signal to the processing circuits 11, receives a HOLD-N control signal from the processing circuits 11, and receives the least significant output signal $SG_1$. The processing circuits 11 and buffer control circuit 16 both receive an externally-generated reset signal RESET-N. END-P is active high, while HOLD-N, RESET-N, and the enable signals $E_1$, $E_2$, and $E_3$ are active low.

Figure 2:
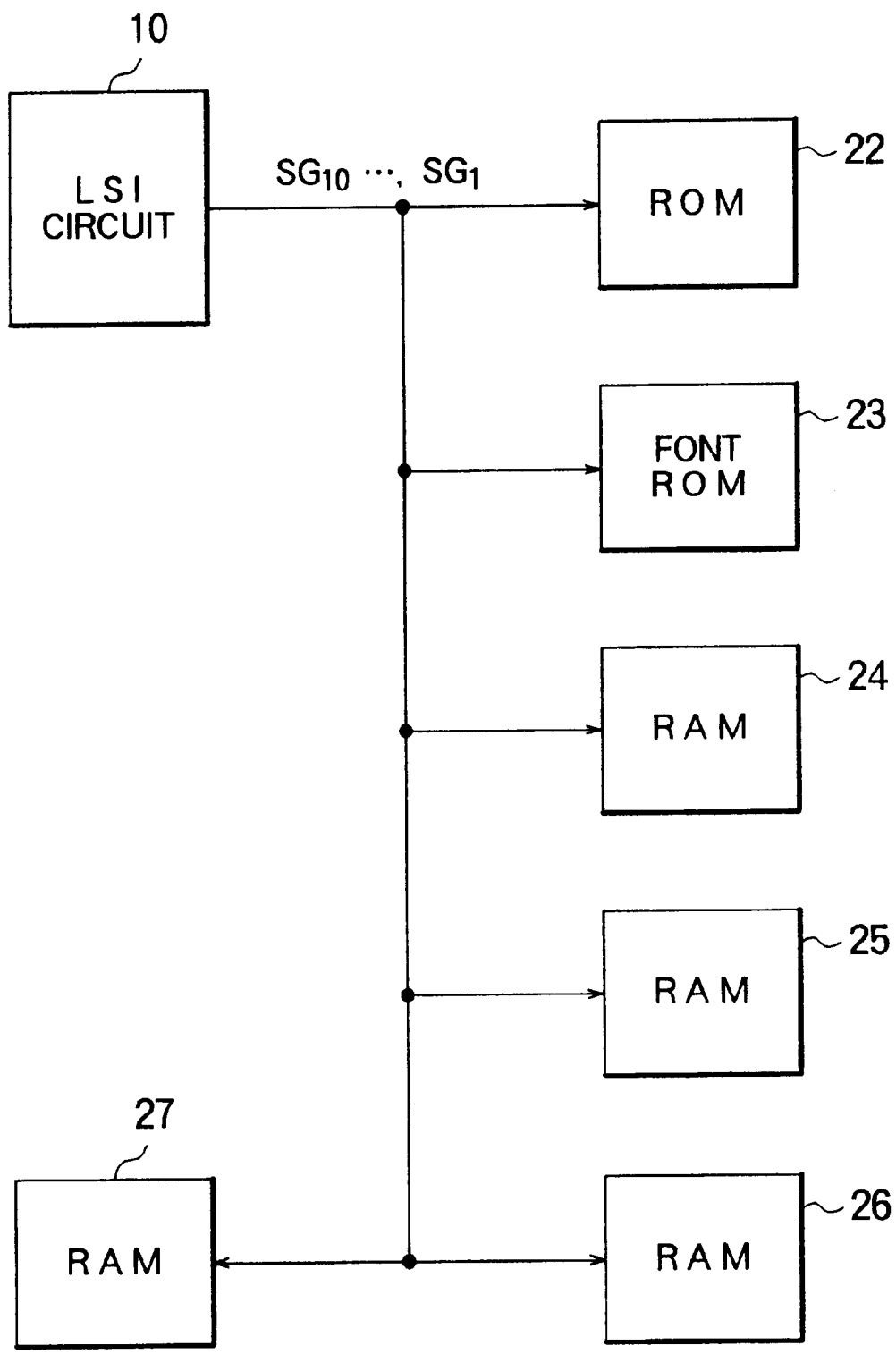
FIG. 2 is a block diagram illustrating loads connected to the large-scale integrated circuit in FIG. 1.

FIG. 2 shows an example of external circuits to which the output signals $SG_i$ may be supplied. In this example, $SG_{10}$, $SC_9$, ..., $SG_1$ are supplied as address signals to a read-only memory (ROM) 22 storing program code, another ROM 23 storing font data, and four random-access memory (RAM) devices 24, 25, 26, and 27. RAM 24 is a standard memory, while RAMs 25, 26, and 27 have been added to expand the memory space. This type of configuration, with standard memory and expansion memory, is common in computers and printers.

To the adjustable buffer circuits in the large-scale integrated circuit 10, the connected memory devices 22 to 27 appear as capacitive loads. The total load capacitance may vary considerably, depending on the number of connected memory devices. The driving capability of the adjustable buffer circuits is adjusted as described below to match the total load capacitance.

Referring again to FIG. 1, each two-state buffer circuit 14 has internal switching elements (not visible) through which the output signal line 17 is coupled to a power-supply node (not visible) if the corresponding bit signal $b_i$ is high, and to a ground node (not visible) if bit signal $b_i$ is low. The output signal line is thereby driven to the high output state when $b_i$ is high, and to the low output state when $b_i$ is low.

A three-state buffer circuit 15 has similar internal switching elements controlled by the bit, signal $b_i$, and additional internal switching elements (not visible) controlled by one of the enable signals $E_1$, $E_2$, and $E_3$. These additional internal switching elements operate so that when the enable signal is active (low), the output signal line 17 is driven to the high output state or low output state according to the value of the bit signal $b_i$. When the enable signal is inactive (high), the output signal line 17 is disconnected from both the power supply and ground and left in the high-impedance state. The three-state buffer circuit 15 is then disabled and does not drive the output signal line 17 or output terminal 12 at all.

The driving capability of a two-state buffer circuit 14 or three-state buffer circuit 15 refers basically to the conductance of its internal switching elements. The driving capability of an adjustable buffer circuit 13 is the sum of the driving capability of the two-state buffer circuit 14 and the driving capabilities of the three-state buffer circuits 15 that are enabled.

Figure 3:
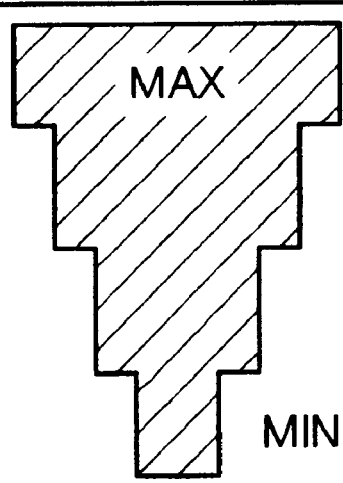
FIG. 3 is a chart showing how driving capability is controlled in the circuit in FIG. 1.

In the present embodiment, all three-state buffer circuits 15 have substantially equal driving capabilities. The buffer control circuit 16 controls the enable signals $E_1$, $E_2$, and $E_3$ as shown in FIG. 3, providing each adjustable buffer circuit 13 with four levels of total driving capability. The maximum driving capability (MAX) is obtained when $E_1$, $E_2$, and $E_3$ are all low; the minimum driving capability (MIN) is obtained when $E_1$, $E_2$, and $E_3$ are all high. Intermediate levels of driving capability are provided by holding $E_3$ high and $E_2$ and $E_1$ low, or $E_3$ and $E_2$ high and $E_1$ low.

The levels of the enable signals $E_1$, $E_2$, and $E_3$ are determined by the buffer control circuit 16 itself when the large-scale integrated circuit is brought out of the reset state. The internal structure and operation of the buffer control circuit 16 will be described next.

Figure 4:
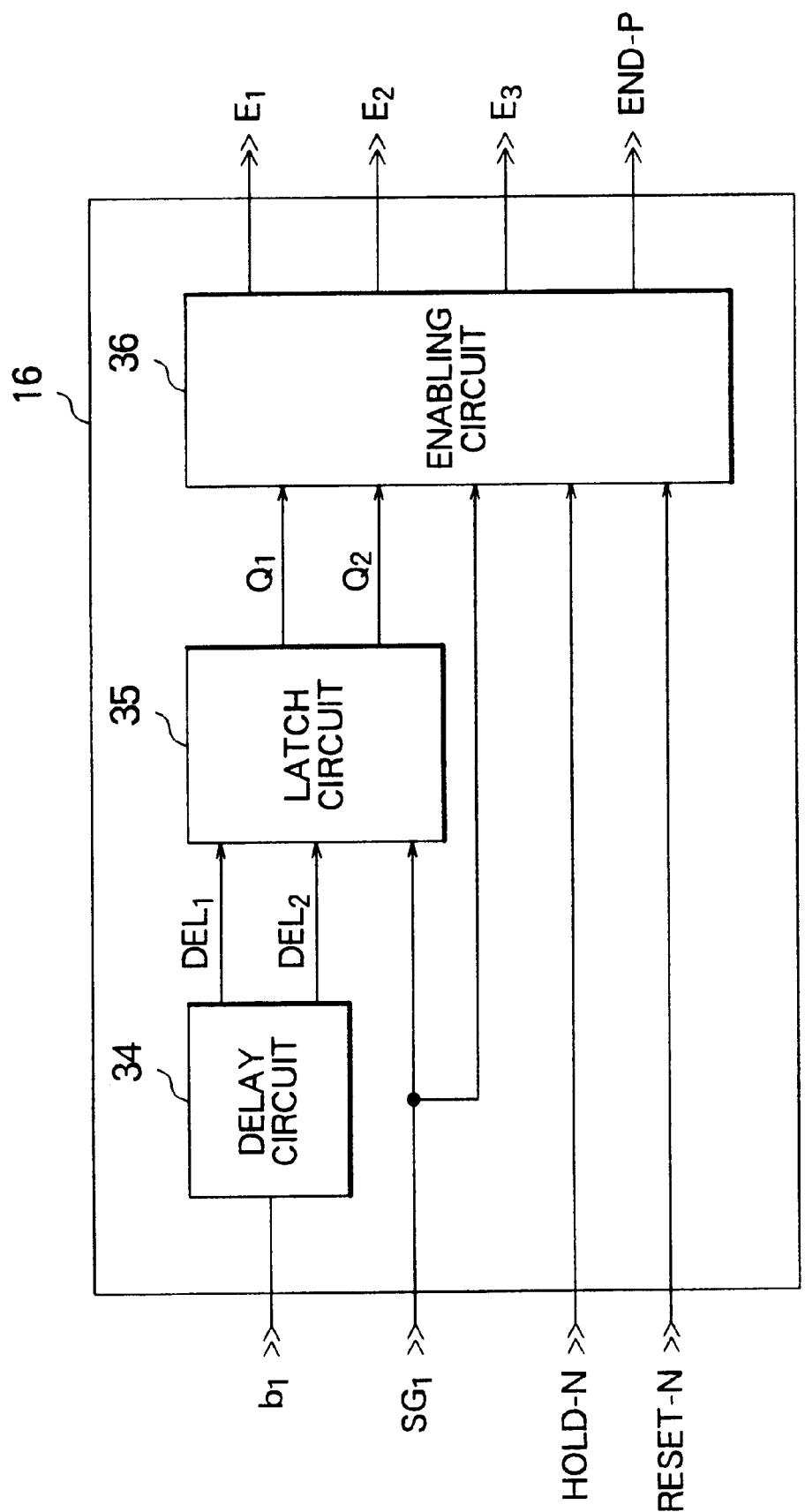
FIG. 4 is a more detailed block diagram of the buffer control circuit in FIG. 1.

Referring to FIG. 4, the buffer control circuit 16 comprises a delay circuit 34, a latch circuit 35, and an enabling circuit 36.

The delay circuit 34 receives the least significant bit signal $b_1$, delays $b_1$ by two different amounts, and thereby generates two delayed signals $DEL_1$ and $DEL_2$.

The latch circuit 35 detects rising transitions of the output signal $SG_1$, and latches the delayed signals $DEL_1$ and $DEL_2$ when the rise of $SG_1$ is detected, thereby sensing the transition time or rise time of $SG_1$ by comparing the timing at which $SG_1$ goes high with the timings at which $DEL_1$ and $DEL_2$ go high. The latched signal values, denoted $Q_1$ and $Q_2$, are supplied to the enabling circuit 36.

The enabling circuit 36 also receives $SG_1$, HOLD-N, and RESET-N. When RESET-N goes low, the enabling circuit 36 resets END-P and the enable signals $E_1$, $E_2$, and $E_3$ to the low logic level. When RESET-N goes high, the processing circuits 11 generate a series of pulses of the least significant bit signal $b_1$, and the enabling circuit 36 adjusts the enable signals $E_1$, $E_2$, and $E_3$ according to the resulting values of the latch output signals $Q_1$ and $Q_2$. When the adjustment is completed, the enabling circuit 36 sets END-P to the high logic level. HOLD-N is used to permit or inhibit the adjustment process.

Figure 5:
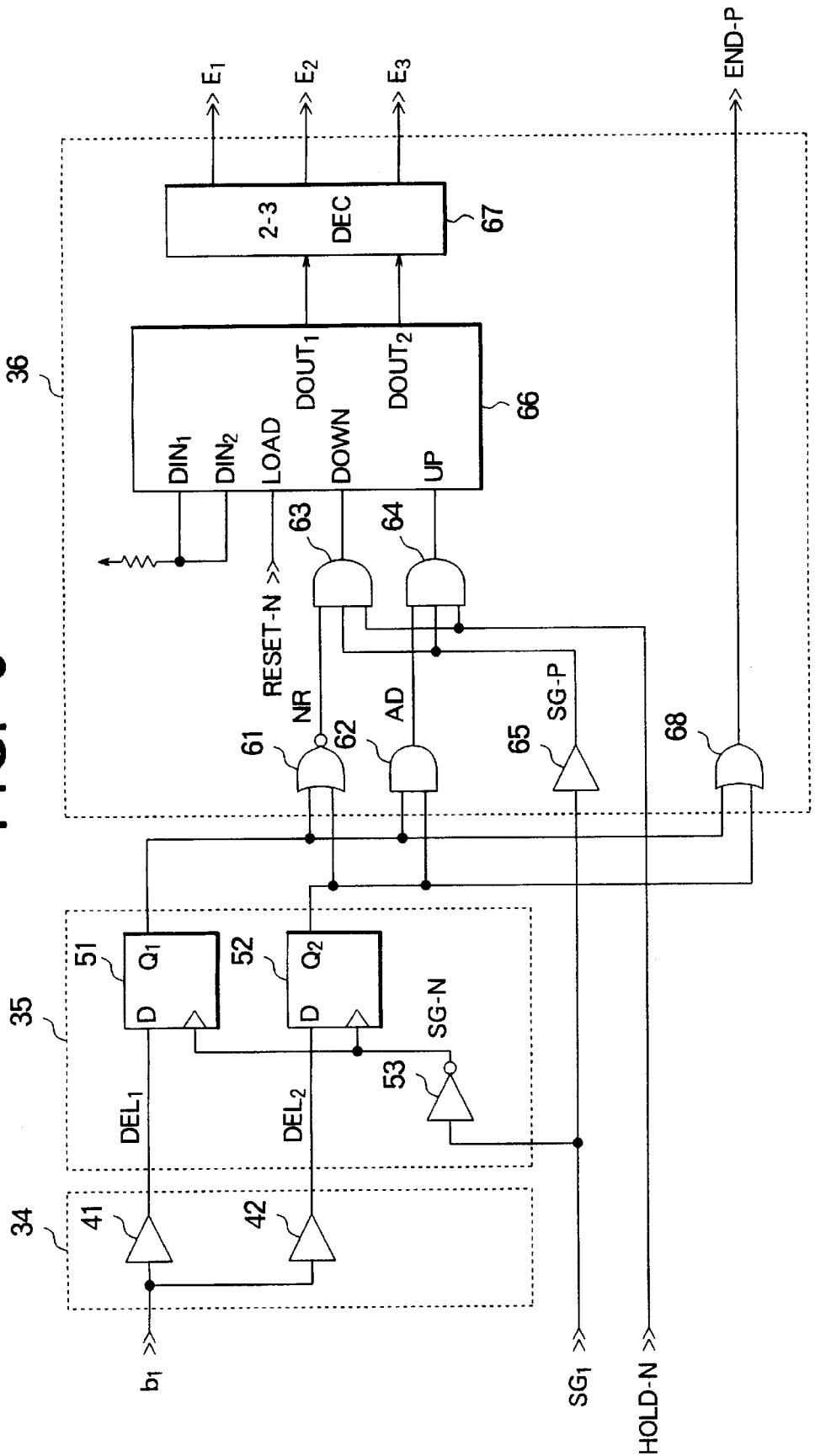
FIG. 5 is a circuit diagram showing the buffer control circuit in FIG. 1 in further detail.

Referring to FIG. 5, the delay circuit 34 comprises a pair of non-inverting buffers 41 and 42, both of which receive the bit signal $b_1$. Buffer 41, which generates the first delayed signal $DEL_1$, has a propagation delay corresponding to the minimum desirable rise time of the output signal $SG_1$. Buffer 42, which generates the second delayed signal $DEL_2$, has a propagation delay corresponding to the maximum desirable rise time of the output signal $SG_1$.

The latch circuit 35 comprises a pair of D-type flip-flops 51 and 52, which receive the delayed signals $DEL_1$ and $DEL_2$, respectively, at their data input terminals (D), and generate the latch output signals $Q_1$ and $Q_2$. The latch circuit 35 also comprises an inverter 53 that inverts $SG_1$ and supplies the resulting inverted signal SG-N to the clock input terminals of the D-type flip-flops 51 and 52. The delayed signals $DEL_1$ and $DEL_2$ are latched at high-to-low transitions of SG-N.

The enabling circuit 36 comprises a NOR gate 61, three AND gates 62, 63, and 64, a non-inverting buffer 65, an up-down counter 66, a two-to-three-line decoder 67, and an OR gate 68.

NOR gate 61 takes the logical NOR of the latch output signals $Q_1$ and $Q_2$ and supplies the resulting signal NR to AND gate 63. AND gate 62 takes the logical AND of the latch output signals $Q_1$ and $Q_2$ and supplies the resulting signal AD to AND gate 64. Non-inverting buffer 65 detects high and low transitions of $SG_1$ and supplies a signal SG-P with corresponding transitions to AND gates 63 and 64. AND gates 63 and 64 also receive the HOLD-N input signal.

The up-down counter 66 has a pair of data input terminals $DIN_1$ and $DIN_2$ that are tied to the high logic level, a LOAD input terminal that receives the RESET-N input signal, a DOWN input terminal that receives the output of AND gate 63, an UP input terminal that receives the output of AND gate 64, and a pair of data output terminals $DOUT_1$ and $DOUT_2$. When RESET-N goes high, the up-down counter 66 latches the data inputs $DIN_1$ and $DIN_2$ as an initial count value, which is output as the value of the data output signals $DOUT_1$ and $DOUT_2$. The initial count value is three (binary '11'), and the data output signals $DOUT_1$ and $DOUT_2$ are initially both high. While RESET-N remains high, the count value is decremented at each low-to-high transition of the DOWN input signal, and incremented at each low-to-high transition of the UP input signal. The data output signals $DOUT_1$ and $DOUT_2$ change accordingly, outputting the count value in binary form.

The decoder 67 decodes the data output signals $DOUT_1$ and $DOUT_2$ to generate the enable signals $E_1$, $E_2$, and $E_3$. The OR gate 68 takes the Logical OR of the latch output signals $Q_1$ and $Q_2$ to generate the END-P output signal.

FIG. 6 summarizes the operation of the up-down counter 66 in response to a high pulse of the bit signal $b_1$, while HOLD-N is high.

The low-to-high transition of bit signal $b_1$ causes $SG_1$ to go high. If the driving capability of the corresponding adjustable buffer circuit 13 is excessive, $SG_1$ will go high before $DEL_1$ and $DEL_2$ go high. As a result, the latch output signals $Q_1$ and $Q_2$ are both low. The low values of $Q_1$ and $Q_2$ cause the NR signal output by NOR gate 61 to be high, and the AD signal output by AND gate 62 to be low. Since $SG_1$ and HOLD-N are both high, the output of AND gate 63 (DOWN) goes high, while the output of AND gate 64 (UP) stays low. The count value of the up-down counter 66 is therefore decremented, and the decremented count is output at the data output terminals $DOUT_1$ and $DOUT_2$.

If the driving capability of the adjustable buffer circuit 13 is suitable, then $SG_1$ will go high between the low-to-high transitions of $DEL_1$ and $DEL_2$. As a result, $Q_1$ is high, $Q_2$ is low, NR and AD are both low, DOWN and UP are both low, and no change takes place in the count value or the data output signals $DOUT_1$ and $DOUT_2$.

If the driving capability of the adjustable buffer circuit 13 is deficient, then $SG_1$ will go high after both $DEL_1$ and $DEL_2$ have gone high. As a result, $Q_1$ and $Q_2$ are both high, NR is low, AD is high, DOWN stays low, UP goes high, the count is incremented, and the data output signals $DOUT_1$ and $DOUT_2$ change accordingly.

When the HOLD-N signal is low, the outputs of both AND gates 63 and 64 are held low, i.e., the UP and DOWN signals are both held low, so no changes take place in the count value or data output. signals $DOUT_1$ and $DOUT_2$, regardless of any activity by bit signal $b_1$.

FIG. 7 summarizes the operation of the decoder 67. When the count is '11' and $DOUT_2$ and $DOUT_1$ are both high, the enable signals $E_1$, $E_2$, and $E_3$ are all high. As the internal count of the up-down counter 66 is decremented (from '11' to '10' to '01' to '00'), first $E_3$, then $E_2$, and finally $E_1$ goes high.

Figure 8:
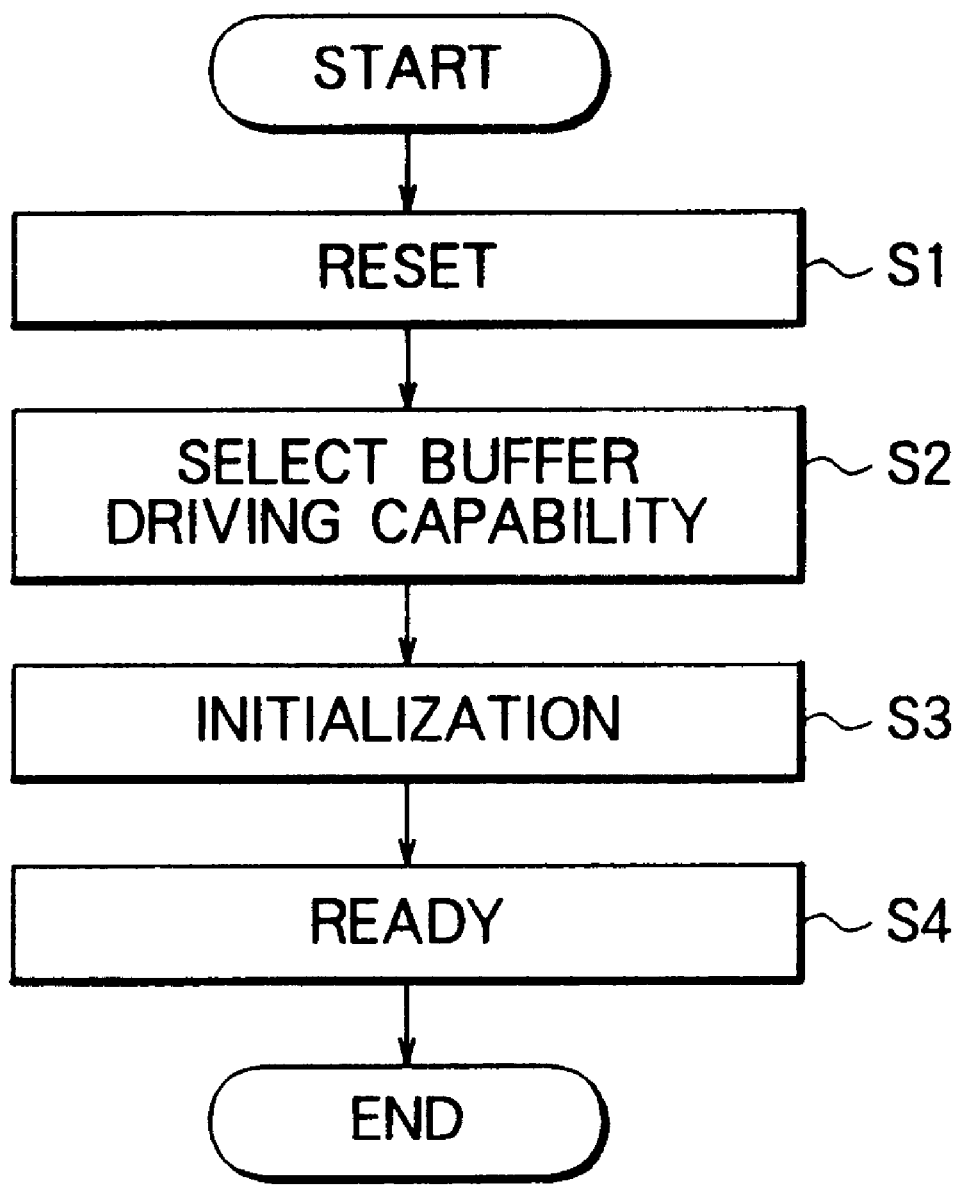
FIG. 8 is a flowchart illustrating the operation of the large-scale integrated circuit in FIG. 1 following a reset.

FIG. 8 illustrates the operation of the large-scale integrated circuit 10 when reset. The reset signal is generated by an external circuit when the power supply of the large-scale integrated circuit 10 is first switched on, and at other times as necessary. While RESET-N is low, the processing circuits 11 and buffer control circuit 16 reset all signals to predetermined initial states (step S1). When RESET-N goes high, the buffer control circuit 16 selects a suitable buffer driving capability, and sets the adjustable buffer circuits 13 to that capability, (step S2). Next, the processing circuits 11 carry out an internal initialization routine (step S3) that does not affect the buffer control circuit 16. The large-scale integrated circuit 10 is then ready to begin normal operation (step S4).

Figure 9:
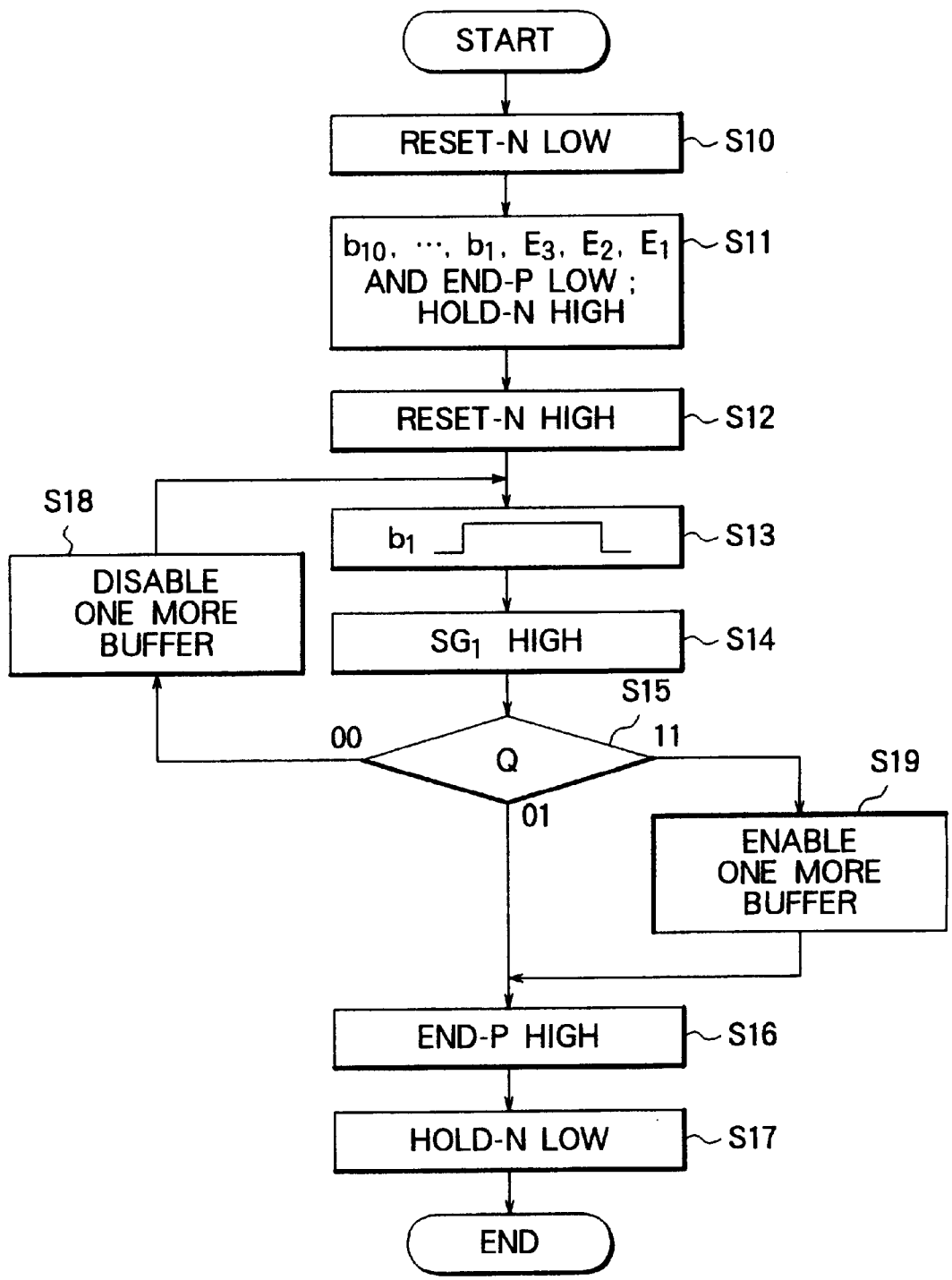
FIG. 9 is a more detailed flowchart illustrating the process by which the buffer driving capability is set.

FIG. 9 illustrates the first two of the above steps in more detail.

The reset state begins when RESET-N goes low (step S10). The processing circuits 11 set all of the bit signals $b_{10}, \ldots, b_1$ to the low level, and HOLD-N to the high level. The buffer control circuit 16 sets END-P and the enable signals $E_1$, $E_2$, and $E_3$ to the low level (step S11).

The reset state ends when RESET-N goes high (step S12). The processing circuits 11 then output a series of three high pulses on the $b_1$ bit signal line, one pulse at a time (step S13). Each $b_1$ pulse causes the output signal $SG_1$ to go high, (step S14), at a timing that depends on the driving capability of the corresponding adjustable buffer circuit 13 and the total capacitance of the connected load. Each $b_1$ pulse should be long enough to allow ample time for $SG_1$ to go high, even if the connected load is the maximum load that can be driven.

What happens after each $b_1$ pulse depends on the resulting values of the latch output signals $Q_1$ and $Q_2$ (step S15).

If the driving capability is suitable, then $Q_1$ will be high and $Q_2$ will be low ('01'), causing the END-P signal to go high (step S16). Upon receiving the high END-P signal, the processing circuits 11 set HOLD-N to the low level (step S17). The processing circuits 11 may cease generating $b_1$ pulses at this point. HOLD-N remains low, inhibiting further adjustment of the buffer driving capability, until the next reset.

If the driving capability is excessive, then in step S15, the latch output signals $Q_1$ and $Q_2$ will both be low ('00'). As explained above, this causes the up-down counter 66 to decrement its internal count, and the decoder 67 to reduce by one the number of enable signals $E_1$, $E_2$, and $E_3$ that are at the low (active) level. One additional three-state buffer circuit 15 in each adjustable buffer circuit 13 is thereby disabled (step S18). When the processing circuits 11 output the next $b_1$ pulse (step S13), the same process is repeated, possibly resulting in the disabling of another three-state buffer circuit. The loop involving steps S13, S14, S15, and S18 is carried out up to three times, until the driving capability is adjusted to a suitable value.

If the driving capability is deficient, then in step S15, the latch output signals $Q_1$ and $Q_2$ will both be high ('11'). This causes the up-down counter 66 to increment its internal count, and the decoder 67 to increase by one the number of active enable signals $E_1$, $E_2$, and $E_3$. One additional three-state buffer circuit 15 in each adjustable buffer circuit 13 is thereby enabled (step S19). In addition, END-P goes high (step S16) and HOLD-N goes low (step S17), inhibiting further changes in the buffer driving capability.

As an exceptional case, if the initial driving capability is deficient, even though all three-state buffer circuits 15 are enabled, then step S19 cannot be carried out, and the adjustment process ends with the buffer driving capability set to the maximum value. As another exceptional case, if the buffer driving capability is still too high after three $b_1$ pulses, even though all three-state buffer circuits 15 are disabled, the processing circuits 11 set HOLD-N to the low level, regardless of END-P, and the adjustment process ends with the buffer driving capability set to the minimum value.

Next, examples of two buffer adjustments will be described with reference to the waveform diagrams in FIGS. 10 and 11. The ones and zeros beside the waveforms indicate the high and low logic levels. During the reset interval, while RESET-N is low, $DOUT_1$, $DOUT_2$, SG-N, NR, and HOLD-N are high, and the other signals shown are all low.

Figure 10:
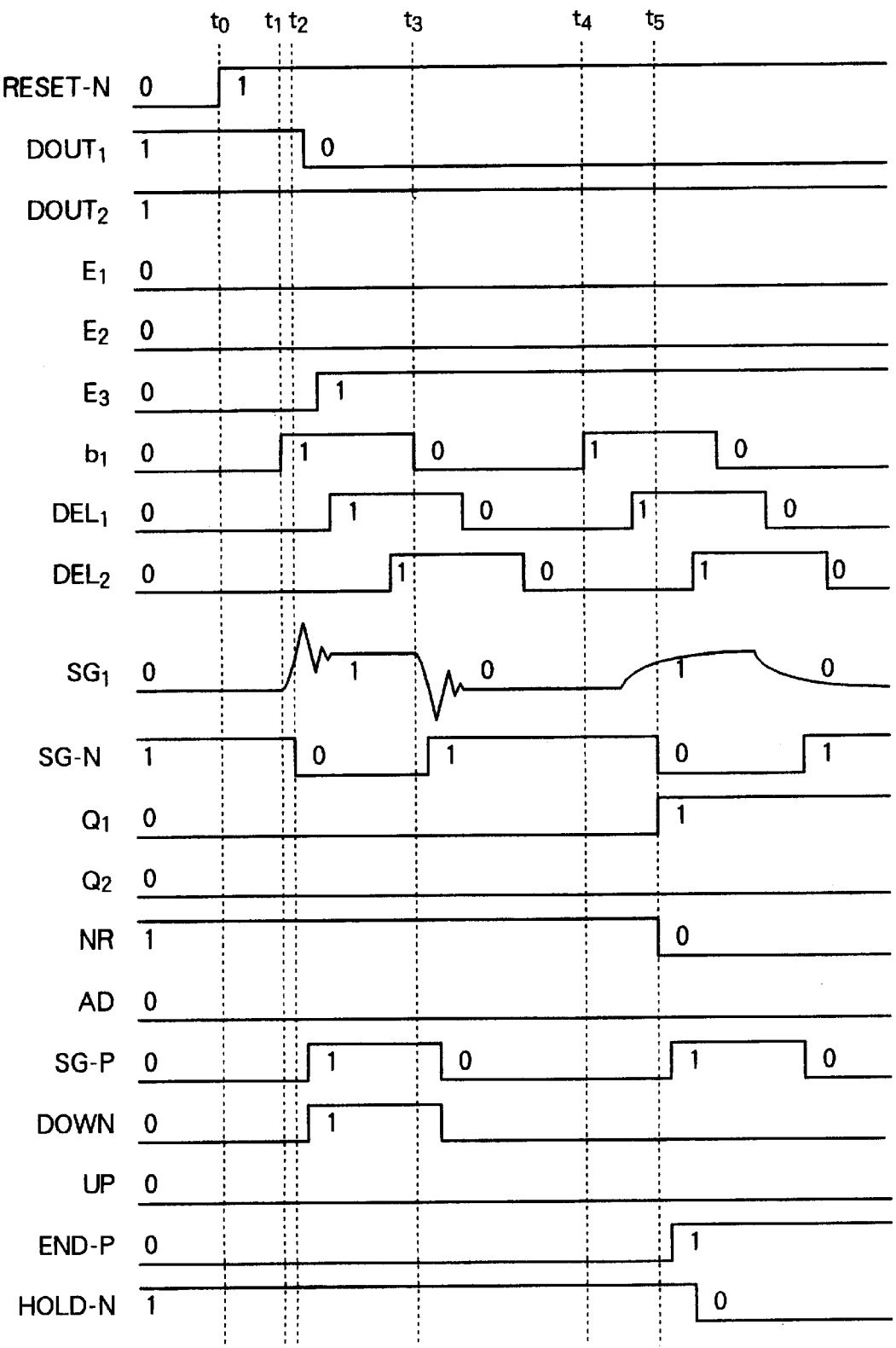
FIG. 10 is a waveform diagram showing an example of the driving-capability setting process.

FIG. 10 shows an example in which a suitable driving capability is obtained by disabling one three-state buffer circuit 15. At time $t_0$, RESET-N goes high and the large-scale integrated circuit 10 comes out of the reset state. At, time $t_1$, the processing circuits 11 drive bit signal $b_1$ high to begin the first pulse. The initial buffer driving capability is excessive, so $SG_1$ rises abruptly, somewhat overshooting the high level. $SG_1$ is recognized as going high at time $t_2$, when the inverted signal SG-N output by the inverter 53 goes low and the non-inverted signal SG-P goes high. The delayed signals $DEL_1$ and $DEL_2$ are still both low, so $Q_1$ and $Q_2$ remain low, NR remains high, and AD remains low. The DOWN signal goes high when SG-P goes high, decrementing the count in the up-down counter 66, causing $DOUT_1$ to go low and $E_3$ to go high. One three-state buffer circuit (B3) in each adjustable buffer circuit 13 is thereby disabled.

The processing circuits 11 drive bit signal $b_1$ low at time $t_3$, ending the first pulse, then high at time $t_4$, beginning the next pulse. $SG_1$ now rises more slowly, and overshoot is avoided. $SG_1$ is recognized as going high at time $t_5$, when $DEL_1$ is high but $DEL_2$ is still low. $Q_1$ goes high at this time, causing NR to go low and END-P to go high. The UP and DOWN signals both remain low. The processing circuits 11 respond to END-P by driving HOLD-N low, ending the adjustment process. Until the next reset, enable signals $E_1$ and $E_2$ will remain low, $E_3$ will remain high, and each adjustable buffer circuit 13 will use buffer circuits B0, B1, and B2 to drive its output terminal 12 with a driving capability suitable for the connected load.

Figure 11:
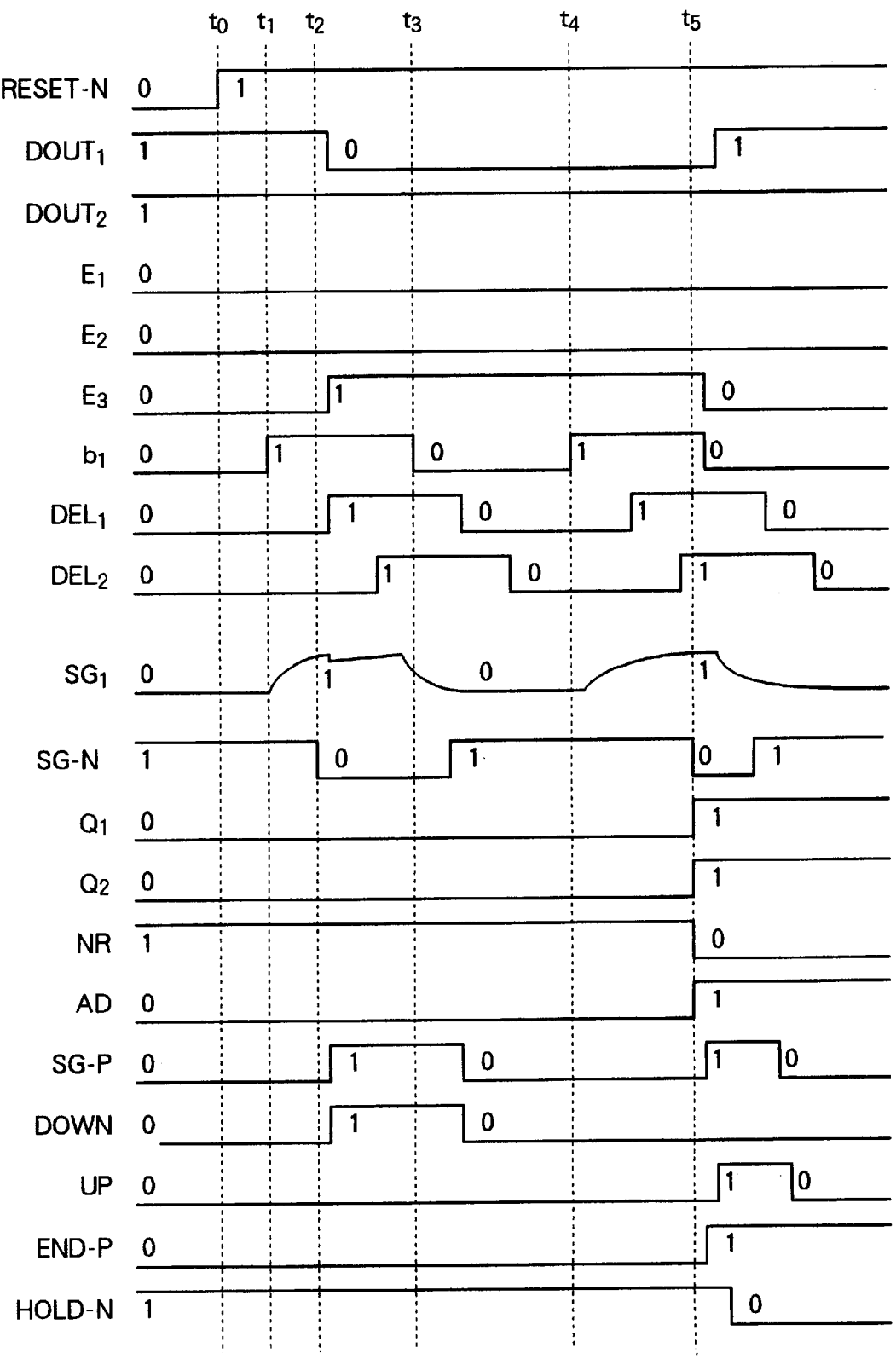
FIG. 11 is another waveform diagram showing an example of the driving-capability setting process.

FIG. 11 shows an example in which the buffer driving capability is over-adjusted, then set back. The reset state ends at time $t_0$ and the first $b_1$ pulse begins at time $t_1$. The initial driving capability is slightly excessive, so when $SG_1$ is recognized as going high at time $t_2$, $DEL_1$ and $DEL_2$ are still both low. The same operations as in FIG. 10 take place, causing enable signal $E_3$ to go high and reducing the buffer driving capability by disabling one three-state buffer circuit (B3).

Bit signal $b_1$ goes low at time $t_3$ and high at time $t_4$. The buffer driving capability is now slightly deficient, so when $SG_1$ is recognized as going high at time $t_5$, $DEL_1$ and $DEL_2$ are both high, causing $Q_1$ and $Q_2$ both to go high, NR to go low, AD to go high, and the UP signal to go high. The count in the up-down counter 66 is thereby incremented, causing $DOUT_1$ to go high again and returning enable signal $E_3$ to the low level. In addition, END-P goes high and the processing circuits 11 bring HOLD-N low. The adjustment process ends with all three enable signals $E_1$, $E_2$, and $E_3$ set to the low level and all three-state buffer circuits 15 enabled.

In this example, a suitable buffer driving capability cannot be obtained, so there is a choice between using a driving capability that is slightly excessive and a driving capability that is slightly deficient. In this situation, it is generally preferable to use the capability that is slightly excessive, and that is the choice made in FIG. 11.

The reason for adjusting the driving capability of all of the adjustable buffer circuits 13 according to the rise time of the least significant output signal $SG_1$ is that if the output signals $SG_{10}$, . . . , $SG_1$ are not all connected to identical loads, the least significant signal $SG_1$ is likely to be connected to one of the largest loads. If all adjustable buffer circuits 13 are adjusted according to this load, then none of the adjustable buffer circuits 13 will be left with a deficient driving capability.

As described above, the invented output buffer circuit, comprising the adjustable buffer circuits 13 and buffer control circuit 16, adjusts the buffer driving capability automatically following a reset, before normal operation of the large-scale integrated circuit 10 begins. The output terminals 12 can accordingly be connected to any capacitive load, within the range from the maximum driving capability to the minimum driving capability of the adjustable buffer circuits 13, without the use of damping resistors or external buffer circuits.

A large-scale integrated circuit 10 employing the invented output buffer circuit has output terminals 12 that are directly connectable to a wide variety of different loads without the need for extra components. This feature simplifies the design and manufacture of apparatus in which the large-scale integrated circuit 10 is used, and enables designs to be modified without the need for extensive engineering changes.

Another feature of the invention is that the processing circuits 11 do not control the enable signals $E_1$, $E_2$, and $E_3$ directly. The processing circuits 11 only have to generate a series of $b_1$ pulses after a reset, and activate HOLD-N in response to END-P. If the processing circuits 11 include a central processing unit, these functions can be carried out by a short and simple software routine. A significant advantage of the invention is that this software routine does not have to be altered when the loads connected to the output terminals 12 are changed.

If the processing circuits 11 do not include a central processing unit, the buffer control circuit 16 itself can be modified by adding circuitry to generate the $b_1$ pulses and HOLD-N.

Many other modifications to the buffer control circuit 16 are possible. For example, signals that were described as active low can be active high instead, or vice versa. A shift register can be employed instead of the up-down counter 66. The OR gate 68 can be replaced by a combination of an exclusive-OR gate operating on $Q_1$ and $Q_2$, and an OR gate operating on AD and the output of the exclusive-OR gate.

The initial driving capability can be the minimum driving capability, in which case up-down counter 66 can be replaced by an up-counter, NOR gate 61 and AND gate 63 can be eliminated, and OR gate 68 can be replaced by a NAND gate.

The adjustable buffer circuits 13 can also be modified. All of their constituent buffer circuits can be three-state buffer circuits, for example, and within each adjustable buffer circuit 13, different three-state buffer circuits may have different driving capabilities, to provide additional levels to which the total driving capability can be adjusted.

No restriction is placed on the number of three-state buffer circuits 15 in each adjustable buffer circuit 13, provided there is at least one. No restriction is placed on the number of bit signal pulses generated following a reset.

No restriction is placed on the number of output terminals 12 controlled by the buffer control circuit 16. There may be only one output terminal 12, for example.

The term large-scale integrated circuit, as used above, sets no limit on the scale of integration. The invention can be practiced in very-large-scale integrated (VLSI) circuits and ultra-large-scale integrated (ULSI) circuits, for example.

Those skilled in the art will recognize that further variations are possible within the scope claimed below.

What is claimed is:

1. An output buffer circuit, disposed in an integrated circuit having processing circuits and a plurality of output terminals comprising:

a buffer control circuit generating a selection signal by sensing a voltage transition time at one of said output terminals and setting said selection signal according to said transition time, the selection signal selecting an output-buffer driving capability; and a plurality of adjustable buffer circuits coupled to said buffer control circuit and to respective output terminals, receiving respective input signals from said processing circuits, each of said adjustable buffer circuits receiving said selection signal, each of said adjustable output buffer circuits having a plurality of buffer circuits selectable by said selection signal, the buffer circuits that are selected by said selection signal driving said respective output terminals according to said input signal.

2. An output buffer circuit, disposed in an integrated circuit having processing circuits and an output terminal, comprising:

a buffer control circuit generating a selection signal;

an adjustable buffer circuit coupled to said buffer control circuit, receiving an input signal from said processing circuits, and having a plurality of buffer circuits selectable by said selection signal, each of said buffer circuits that is selected by said selection signal driving said output terminal according to said input signal, wherein said buffer control circuit senses a voltage transition time at said output terminal, and sets said selection signal according to said transition time and said processing circuits generate a series of pulses of said input signal when said integrated circuit is released from said reset state, and said buffer control circuit adjusts said selection signal according to the transition time produced by said pulses at said output terminal, until said transition time indicates that said adjustable output buffer circuit has a suitable driving capability.

3. The output buffer circuit of claim 1, wherein said plurality of output terminals form a bus having a least significant output terminal, and said buffer control circuit sets said selection signal according to a transition time at the least significant output terminal.

4. An output buffer circuit receiving a plurality of bit signals from processing circuits in an integrated circuit and outputting corresponding output signals from a plurality of output terminals of the integrated circuit, comprising:

a buffer control circuit generating at least one enable signal by sensing a voltage transition time at one of said output terminals and setting said enable signal according to said transition time; and a plurality of adjustable buffer circuits coupled to said buffer control circuit, all of said adjustable buffer circuits receiving said enable signal, each adjustable buffer circuit among said plurality of adjustable buffer circuits being coupled to a respective output terminal among said output terminals, each said adjustable buffer circuit having at least two buffer circuits receiving one bit signal among said bit signals, each of said buffer circuits having an output signal line connected to said output terminal, said buffer circuits driving respective output signal lines to a state selected from among a high output state and a low output state responsive to said bit signal, at least one of the buffer circuits in each said adjustable buffer circuit being a three-state buffer circuit coupled to said buffer control circuit and placing its respective output signal line in a high-impedance state responsive to said enable signal.

5. The output buffer circuit of claim 4, wherein all but one of said buffer circuits are three-state buffer circuits, and each of said three-state buffer circuits is controlled by a separate enable signal from said buffer control circuit.

6. The output buffer circuit of claim 4, wherein said buffer control circuit senses a transition time of said output signal, and sets said enable signal according to said transition time, to provide a total driving capability suitable for a load connected to said output terminal.

7. The output buffer circuit of claim 5, wherein said buffer control circuit senses said transition time and sets said enable signal in response to at least one pulse of said bit signal, generated following a reset of said integrated circuit.

8. An output buffer circuit receiving a bit signal from processing circuits in an integrated circuit and outputting a corresponding output signal from an output terminal of the integrated circuit, comprising:

a buffer control circuit generating at least one enable signal, wherein said buffer control circuit senses a transition time of said output signal and sets said enable signal in response to at least one pulse of said bit signal, the enable signal being generated following a reset of said integrated circuit; and at least two buffer circuits receiving said bit signal, each of said buffer circuits having an output signal line connected to said output terminal, said buffer circuits driving respective output signal lines to a state selected from among a high output state and a low output state responsive to said bit signal, wherein all but one of said buffer circuits are three-state buffer circuits, each three-state buffer circuit being coupled to said buffer control circuit and controlled by a separate enable signal from said buffer control circuit, the three-state buffer circuits placing their respective output signal lines in a high-impedance state responsive to said enable signals, said buffer control circuit comprising:

a delay circuit for delaying said bit signal by two different amounts, corresponding to a minimum desirable transition time of said output signal and a maximum desirable transition time of said output signal, thereby generating two delayed signals;

a latch circuit for latching said two delayed signals when a transition of said output signal occurs, thereby comparing the transition time of said output signal with said two different amounts, and generating two latch output signals; and an enabling circuit for controlling said enable signal according to said two latch output signals.

9. The output buffer circuit of claim 8, wherein said enabling circuit controls said enable signal so as to decrease said total driving capability if a transition of said output signal occurs before corresponding transitions of both of said two delayed signals.

10. The output buffer circuit of claim 8, wherein said enabling circuit controls said enable signal so as to increase said total driving capability if a transition of said output signal occurs after corresponding transitions of both of said two delayed signals.

11. The output buffer circuit of claim 8, wherein following said reset, said enabling circuit sets said total driving capability to a maximum value, then reduces said total driving capability until said transition of said output signal occurs after the corresponding transition of at least one of said two delayed signals, increases said driving capability once if said transition of said output signal occurs after the corresponding transitions of both of said delayed signals, and leaves said total driving capability set at a resulting value until a next reset of said integrated circuit.

12. The output buffer circuit of claim 8, wherein said enabling circuit comprises an up-down counter that counts in one direction when said two latch output signals are both high, and counts in an opposite direction when said two latch output signals are both low.

13. The output buffer circuit of claim 8, wherein said enabling circuit comprises a logic gate generating an end signal responsive to said two latch output signals, when said two latch output signals indicate that said enable signal has been set to a most desirable state.

* * * * *